Oct. 5, 1954 L. L. KOROS 2,691,077

TRANSISTOR POWER AMPLIFIER

Filed March 31, 1951

INVENTOR
Leslie L. Koros
BY H. L. Newton
ATTORNEY

Patented Oct. 5, 1954 2,691,077

UNITED STATES PATENT OFFICE 2,691,077

TRANSISTOR POWER AMPLIFIER

Leslie L. Koros, Camden, N. J., assignor to Radio Corporation of America, a corporation of Delaware Application March 31, 1951, Serial No. 218,637

2 Claims. (Cl. 179—171)

Figure 1:
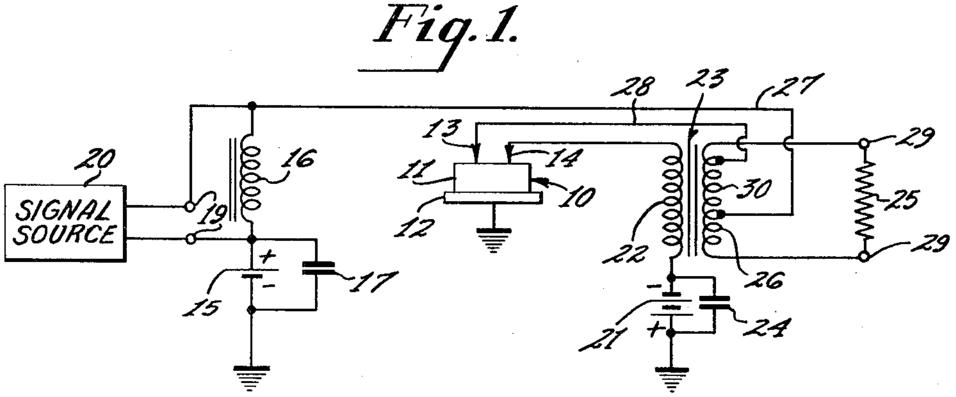

This invention relates generally to amplifier systems, and particularly relates to a power amplifier of the transistor type.

Transistor amplifier circuits are known in the art. A transistor may be defined as a semi-conductor device having a semi-conducting body provided with a base electrode, an emitter electrode and a collector electrode. The base electrode is in low-resistance contact with the semi-conducting body which may, for example, consist of a crystal of silicon or germanium. The emitter and collector electrodes are in rectifying contact with the crystal.

A conventional transistor amplifier circuit may have the input signal impressed on the emitter and the amplified output signal derived from the collector. Accordingly, the base electrode is the common input and output electrode and may be grounded. A transistor amplifier circuit of this type normally has a fairly high voltage gain and comparatively low signal distortion. However, if such a transistor amplifier circuit is used as a power amplifier, signal distortion may become appreciable. It is believed that this signal distortion is caused in many cases by the non-linear emitter voltage-emitter current characteristic. In other words, the input impedance which appears looking into the emitter electrode is low and this input impedance varies with amplitude variations of the input signal. Consequently, the input signal such as a sinusoidal wave may appear distorted in the output circuit.

It is accordingly an object of the present invention to provide an improved transistor power amplifier circuit which produces for most practical applications substantially negligible distortion of the signal to be amplified.

A further object of the invention is to provide a transistor power amplifier circuit having a substantially constant current input, thereby to reduce inherent distortion to a minimum.

Another object of the invention is to provide a power amplifier of the type referred to having a simplified input circuit which provides for a better impedance match between the amplifier and its signal source.

In accordance with the present invention, a feedback connection is provided between the output circuit and the emitter electrode. The output circuit may, for example, consist of a transformer having its primary winding connected between collector and base electrodes. A load circuit, including a load impedance element, is connected across the transformer secondary winding. The feedback connection may include a portion of the transformer secondary winding connected in series with the signal source and the emitter electrode. The feedback preferably is negative to provide degeneration. It is, of course, well known that a negative feedback connection will normally reduce the signal distortion of an amplifier. However, in accordance with the present invention, it has been found that the reduction of the signal distortion obtained with the circuit of the invention is appreciably greater than could be expected by the normal effect of negative feedback.

This is due to the fact that the load impedance element, as well as the impedance which appears looking into the collector electrode are effectively connected in series with the emitter electrode by means of the output transformer. Consequently, the negative feedback effects which are in series with the emitter electrode raise the effective input impedance of the circuit. Accordingly, the emitter input impedance is a smaller portion of the total input impedance and the variations of the effective emitter input impedance with variations of the input signal are appreciably reduced.

Figure 2:
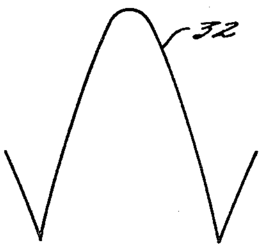
Figure 3:
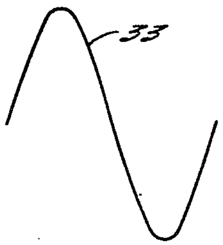

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is a circuit diagram of a power amplifier circuit embodying the present invention; and Figures 2 and 3 are graphs illustrating the output waves obtained respectively with a conventional transistor amplifier circuit and with the amplifier circuit of Figure 1.

Referring now to the drawing, there is shown in Figure 1 a power amplifier circuit including a semi-conductor device 10. Device 10 includes a body 11 of semi-conducting material which may, for example, consist of silicon or germanium and which preferably is of the N type. Base electrode 12, emitter electrode 13 and collector electrode 14 are in contact with body 11. The base 12 is in low-resistance contact with body 11 and may, for example, consist of a suitable block of brass soldered to one surface of the crystal 11. Emitter 13 and collector 14 are in rectifying contact with body 11 and may, for example, consist of point electrodes or they may be in line contact with the body.

The emitter 13 is biased in the forward direction with respect to the base 12, while the collector 14 is biased in the reverse direction with respect to the base 12. If the body 11 is of the N type, emitter 13 should be positive and collector 14 negative with respect to the base 12. Accordingly, a suitable source of voltage such as battery 15 may be provided which has its negative terminal grounded, while its positive terminal is connected to emitter 13 through choke coil 16. Battery 15 may be bypassed for signal frequency currents by capacitor 17.

A signal source schematically indicated at 20 is connected to input terminals 19 connected in turn across choke coil 16 included in the signal input circuit. The signal developed by source 20 may, for example, be an audio-frequency signal and the source may consist, for example, of another transistor amplifier or the signal may be derived directly from a microphone. The choke coil 16 presents a high impedance to the signal developed by source 20 and a low impedance to the direct current applied to the emitter 13 through battery 15.

For the purpose of applying a voltage in the reverse direction between collector 14 and base 12, there may be provided a suitable source of voltage such as battery 21 having its positive terminal grounded. The negative terminal of battery 21 is connected to collector 14 through the primary winding 22 of transformer 23. Base electrode 12 is grounded as shown. Battery 21 may also be bypassed for signal frequency currents by bypass capacitor 24.

A load impedance element such as a resistor 25 is connected to output terminals 29 connected in turn across the secondary winding 26 of transformer 23. The load impedance element 25 connected across the output load circuit represents the useful load of the amplifier circuit which may, for example, be a succeeding amplifier stage or a telephone, relay, or the like.

In accordance with the present invention, by means of leads 27 and 28, an intermediate portion 30 of secondary winding 26 is connected in series with the source 20 between emitter 13 and base 12. Accordingly, a feedback connection is provided between the output circuit and emitter electrode 13. Preferably, windings 22 and 26 are wound in such a manner that the feedback is negative to provide degeneration.

Experiments have shown that the power amplifier circuit of the invention permits an appreciable reduction of the signal distortion. Thus, curve 32 of Figure 2 illustrates the output wave obtained with a conventional transistor amplifier circuit which does not have the feedback connection shown in Figure 1. Curve 33 of Figure 3 illustrates the output wave obtained with the amplifier of Figure 1. It will be observed that curve 33 is a perfect sine wave which almost faithfully reproduces the sinusoidal input wave with a distortion of 2 to 3 per cent, while curve 32 of Figure 2 shows a considerable distortion which may amount to about 25 to 30 per cent. The distortion obtained with the amplifier circuit of the present invention amounts in most cases to considerably less than 5 per cent.

The experiments have further shown that the reduction of the distortion obtained with the amplifier circuit of the invention is considerably larger than could be expected by the effect of a negative feedback connection. This unexpected high reduction of the distortion may be explained in the following manner. As pointed out previously, the resistance which appears looking into emitter electrode 13 is comparatively small and may be of the order of a few hundred ohms. This input resistance varies with a variation of the input signal. The feedback connection 27, 28, 30 provided in accordance with the invention effectively connects the load impedance element 25 as well as the internal collector resistance, that is, the resistance which appears looking into the collector electrode 14 in series with the source 20 and the emitter 13. The load resistance 25 and the collector impedance are connected in parallel by the output transformer 23. Accordingly, the effective input resistance is raised, which in turn, causes a reduction of the distortion because the variation of the effective input impedance with signal variations is reduced.

It will be obvious that the amplifier circuit of the present invention requires a higher driving power. However, it has been found that the increase of the driving power is not lost but appears across the load resistor 25 except for the portion of the driving power which is dissipated by the internal collector resistance. If the internal collector resistance is high compared with the resistance of load resistor 25, the load resistance absorbs the major part of the excess driving power. We much consider, of course, the reflected internal collector resistance ratio to the reflected load resistance on the same winding of the output transformer 23, for example, on winding 30, which is connected in series with the transistor driver current.

In the following, an expression is computed for the reduction of the distortion in the transistor feedback amplifier, compared with an amplifier without degenerative feedback. The feedback voltage, derived from the collector output circuit is $E_f$ ($E_f$ is always negative.). $E_L$ is the output voltage developed across the load resistor 25. The voltage gain of the amplifier without feedback is expressed by A. The internal emitter resistance is $R_e$. During the impressed alternating current excitation cycle the internal emitter resistance is subject to a change of $\Delta R_e$. $I_e$ is the exciting emitter current. The distortion without feedback is D, and with feedback becomes $d$. We may write as an approximation:

$$d \approx D \frac{(R_e+\Delta R_e+E_f/I_e)R_e}{(1-A.E_f/E_L)(R_e+E_f/I_e)(R_e+\Delta R_e)}$$

An important feature of the feedback circuit of the present invention is the fact that at frequencies below approximately 100 kc. there is substantially no phase shifting between the collector and emitter voltages. This feature of the transistor amplifier circuit contributes to its stability. The feedback values applied in an experimental test were as high as 30 db (decibels). Even with such high feedback values there was no tendency to oscillate between the frequency limits of 30 cycles and 100 kc. for the input signal. However, it has been found that the use of feedback factors higher than 10 to 15 db does not provide additional practical improvements. If the feedback factor is sufficiently high, the direct contribution of the driving source to the output power can become higher than that of the amplified output signal developed by the transistor amplifier.

In an audio amplifier circuit without the feedback connection in accordance with the invention the following data were obtained: The emitter driving voltage was .28 volt R. M. S. and the effective emitter resistance was 123.5 ohms. The driving power was .635 milliwatt and the output power 14.1 milliwatts. The power gain was 13.4 db. If the feedback connection of the present invention is used with a 9.4 db feedback, the following values were obtained: In order to obtain the same output power, a higher driving voltage had to be applied which now amounts to .94 volt R. M. S. The voltage developed across the intermediary portion 30 of the secondary winding 26 was .7 volt R. M. S. Accordingly, the voltage applied to the emitter 13 was .24 volt R. M. S. The effective emitter input resistance was increased to 490 ohms so that the power of the driver source was 1.8 milliwatts. The power which excites the emitter was reduced to .45 milliwatt, while the power absorbed by the load resistor 25 and by the internal collector resistance was 1.35 milliwatts. The resistance reflected into the emitter circuit amounted to 366.5 ohms.

There has thus been disclosed a transistor power amplifier circuit which has substantially no distortion of the output signal. The input circuit may be considerably simplified and provides for a better impedance match between the signal source and the transistor because the effective input impedance may be raised appreciably. The reduction of the distortion is due to the fact that the internal collector impedance and the output load impedance are reflected into the emitter circuit. Although the transistor amplifier circuit requires a higher driving power, most of the additional driving power is utilized in the output load, provided the internal collector impedance is higher than the load impedance.

If the applied feedback is high, the apparent driving power may become as high as the output of the driver transistor. In a two-stage transistor amplifier circuit the driver transistor output is mainly absorbed also by the load of the second stage. Thus, a two-stage transistor amplifier produces in this manner an output wave with limited distortion and the power output of the two cascaded stages is absorbed, with a low loss factor, in the load impedance of the second transistor stage.

The feedback can be applied over two or more transistor amplifier stages which are coupled in cascade. From the output of any amplifier the feedback can be applied to the input of any of the previous amplifier stages.

What is claimed is:

1. A power amplifier comprising a semiconductor device including a semiconducting body, a base electrode, an emitter electrode and a collector electrode in contact with said body, means for applying operating potentials to said electrodes, said base electrode being connected to a point of fixed reference potential, an input circuit including a pair of terminals and a first impedance element connected between said pair of terminals, one of said pair of terminals being connected to said point of fixed reference potential, a source of signal coupled across said first impedance element, an output transformer having a primary and a secondary winding, said primary winding being connected between said collector electrode and said point of fixed reference potential, said emitter electrode being directly connected to a tap on said secondary winding, conductive circuit means connecting the other of said pair of terminals with an intermediate tap on said secondary winding, and a load impedance element connected across said secondary winding, thereby to connect a portion of said secondary winding in series with said emitter electrode to reduce distortion of said signal.

2. A power amplifier comprising a semiconductor device including a semiconducting body, a base electrode, an emitter electrode and a collector electrode in contact with said body, means for applying operating potentials to said electrodes, said base electrode being connected to a point of fixed reference potential, an input circuit including a first impedance element having a pair of terminals, one of said pair of terminals being connected to said point of fixed reference potential, an output circuit for developing an amplified output signal and including a transformer having a primary winding and a secondary winding, said primary winding being connected between said collector electrode and said point of fixed reference potential, said secondary winding including a pair of output terminals and a pair of intermediate taps, a load impedance element connected between said output terminals, and a negative feedback circuit directly connecting one of said taps with said emitter electrode and the other of said taps with the other of said pair of terminals,.

References Cited in the file of this patent

UNITED STATES PATENTS

| Number | Name | Date |
|---|---|---|
| 2,302,493 | Dome | Nov. 17, 1942 |
| 2,322,264 | Turner | June 22, 1943 |
| 2,323,634 | Slooten et al. | July 6, 1943 |
| 2,517,960 | Barney et al. | Aug. 8, 1950 |
| 2,524,035 | Bardeen et al. | Oct. 3, 1950 |
| 2,533,001 | Eberhard | Dec. 5, 1950 |
| 2,541,322 | Barney | Feb. 13, 1951 |
| 2,566,057 | Devine | Aug. 28, 1951 |
| 2,609,459 | Bergson | Sept. 2, 1952 |

OTHER REFERENCES

"Radio Engineering," text by Terman, 3d ed., pages 311–313, 322–324, 325, 326, pub. 1947, McGraw-Hill Book Co., N. Y. C. (Copy in Div. 69.)

Reich text, "Theory and Applications of Electron Tubes," page 307, pub. 1939, McGraw-Hill Book Co., N. Y. C. (Copy in Patent Office Library.)